United States Patent
Dale et al.

(10) Patent No.: US 6,545,521 B2
(45) Date of Patent: Apr. 8, 2003

(54) LOW SKEW, POWER SEQUENCE INDEPENDENT CMOS RECEIVER DEVICE

(75) Inventors: Bret R. Dale, Burlington, VT (US); Joseph A. Iadanza, Hinesburg, VT (US); Douglas W. Stout, Milton, VT (US); Sebastian T. Ventrone, South Burlington, VT (US); Hongfei Wu, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/895,778

(22) Filed: Jun. 29, 2001

(65) Prior Publication Data

US 2003/0001642 A1 Jan. 2, 2003

(51) Int. Cl.[7] .................................................. H03L 5/00
(52) U.S. Cl. ......................................... 327/333; 327/62
(58) Field of Search ................................ 327/333, 198, 327/143; 326/62, 63, 68, 80, 81

(56) References Cited

U.S. PATENT DOCUMENTS

| | | | | |
|---|---|---|---|---|
| 3,950,654 A | | 4/1976 | Broedner et al. ............ 307/208 |
| 4,506,164 A | | 3/1985 | Higuchi ....................... 307/264 |
| 4,929,852 A | | 5/1990 | Bae .............................. 307/475 |
| 4,982,111 A | * | 1/1991 | Nakaizumi ................... 327/208 |
| 5,332,934 A | | 7/1994 | Hashimoto et al. ......... 307/475 |
| 5,408,147 A | | 4/1995 | Yarbrough et al. .......... 326/68 |
| 5,422,523 A | | 6/1995 | Roberts et al. .............. 326/68 |
| 5,440,244 A | | 8/1995 | Richter et al. ............... 326/37 |
| 5,469,080 A | | 11/1995 | Son .............................. 326/81 |
| 5,469,082 A | | 11/1995 | Bullinger et al. ............. 326/81 |
| 5,578,957 A | * | 11/1996 | Erhart et al. ................. 327/333 |
| 5,583,454 A | | 12/1996 | Hawkins et al. .............. 326/81 |
| 5,585,744 A | | 12/1996 | Runas et al. ................. 326/86 |
| 5,610,791 A | | 3/1997 | Voldman ....................... 361/56 |
| 5,680,064 A | | 10/1997 | Masaki et al. ................ 326/81 |
| 5,734,585 A | | 3/1998 | Beard ........................... 326/63 |
| 5,804,998 A | | 9/1998 | Cahill et al. ................. 327/333 |
| 5,818,261 A | | 10/1998 | Perner ........................... 326/86 |
| 5,847,581 A | | 12/1998 | Allen ........................... 316/81 |
| 5,848,101 A | | 12/1998 | Taylor ......................... 375/257 |
| 5,852,540 A | | 12/1998 | Haider .......................... 326/81 |
| 5,862,390 A | | 1/1999 | Ranjan .......................... 326/80 |
| 5,959,490 A | | 9/1999 | Candage et al. ............ 327/333 |
| 6,040,708 A | | 3/2000 | Blake et al. .................. 326/33 |
| 6,107,857 A | | 8/2000 | Orisaka et al. .............. 327/333 |
| 6,255,888 B1 | * | 7/2001 | Satomi ........................... 326/62 |
| 6,288,591 B1 | * | 9/2001 | Riccio ........................... 326/81 |

FOREIGN PATENT DOCUMENTS

JP    5-315931   * 11/1993

* cited by examiner

Primary Examiner—Timothy P. Callahan
Assistant Examiner—Linh Nguyen
(74) Attorney, Agent, or Firm—Schmeiser, Olsen & Watts; Richard A. Henkler

(57) ABSTRACT

The present invention provides a receiver device having multiple voltage supplies that allows the output stage of the receiver device to go to a safe state whenever its voltage is disconnected or powered-down, independent of any of its normal control circuits. Furthermore, the isolation of the multiple voltage supplies provides a low skew at the output of the receiver device.

11 Claims, 6 Drawing Sheets

LOW SKEW, POWER SEQUENCE INDEPENDENT CMOS RECEIVER DEVICE

BACKGROUND OF THE INVENTION

1. Technical Field

The invention relates generally to semiconductor devices and more specifically to semiconductor receiver devices.

2. Related Art

As CMOS semiconductor devices becomes increasingly complex, two or more voltage supplies are often needed on each chip to provide for devices operating at different operating levels. For example, an off-chip receiver usually operates at a different operating value than the internal circuitry of the chip. Current hardware will allow for multiple voltages on the same chip.

Most circuits have been designed to allow for correct operation while both voltages are on, or powered-up in a certain sequence. However, during some portion of the operational period of the system, the voltage for a particular device may be turned off. With prior devices that had a single power supply, turning off a particular device resulted in no damage to the device, but with multiple power devices, a risk may exist if the power supplies are turned off or on at different times or in the wrong sequence. For example, the power for a receiver device may be disconnected while leaving the core power supply connected. Due to the nature of the devices, the internal circuit nodes can drift high. In normal operation, internal logic may require two receivers to be in opposite states. Due to the powered-off state of selected receivers, a state may occur which is outside of the design boundaries and result in permanent damage to the chip.

Accordingly, a need has developed in the art for a receiver device that allows the output stage of the receiver device to go to a safe state (e.g., a voltage low) whenever its voltage is disconnected, independent of any of its normal control circuits.

SUMMARY OF THE INVENTION

The present invention provides a receiver device having multiple voltage supplies that allows the output stage of the receiver to go to a safe state whenever its voltage is disconnected or powered-down.

Generally, the present invention provides a receiver device comprising:
 a first and second voltage supply;
 an input circuit using said second voltage supply for receiving an input;
 a power sequence circuit using said first voltage supply, said power sequence circuit coupled to said input circuit and outputting an output corresponding with said input when enabled and placing said output into a safe state when disabled; and
 an enable circuit, coupled to said power sequence circuit, for enabling and disabling said power sequence circuit corresponding to a voltage level of said second voltage supply.

In addition, the present invention provides a method of producing a valid output for a receiver device having a first and second voltage supply comprising the steps of:
 a) sensing a voltage level of said second voltage supply with an enable circuit;
 b) producing an enable signal from said enable circuit at a first voltage level when said second voltage supply is above a predetermined value;
 c) producing an enable signal from said enable circuit at a second voltage level when said second voltage supply drops below a predetermined value;
 d) enabling a power sequence circuit with said enable signal at said first voltage level;
 e) disabling said power sequence circuit with said enable signal at said second voltage level;
 f) outputting an output of said receiver device corresponding with an input of said receiver device when said power sequence circuit is enabled; and
 g) placing said output of said receiver device at a safe voltage level when said power sequence circuit is disabled.

The present invention also provides a system having at least one receiver device comprising:
 a first and second voltage supply for each of at least one receiver device;
 an input circuit for each receiver device using said second voltage supply for receiving an input;
 at least one power sequence circuit for each receiver device using said first voltage supply, each of said power sequence circuit coupled to said input circuit and outputting an output corresponding with said input when enabled and placing said output in a safe voltage level when disabled; and
 an enable circuit, coupled to at least one of said power sequence circuit, for enabling and disabling said power sequence circuit corresponding to a voltage level of said second voltage supply.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF THE DRAWINGS

Figure 1:
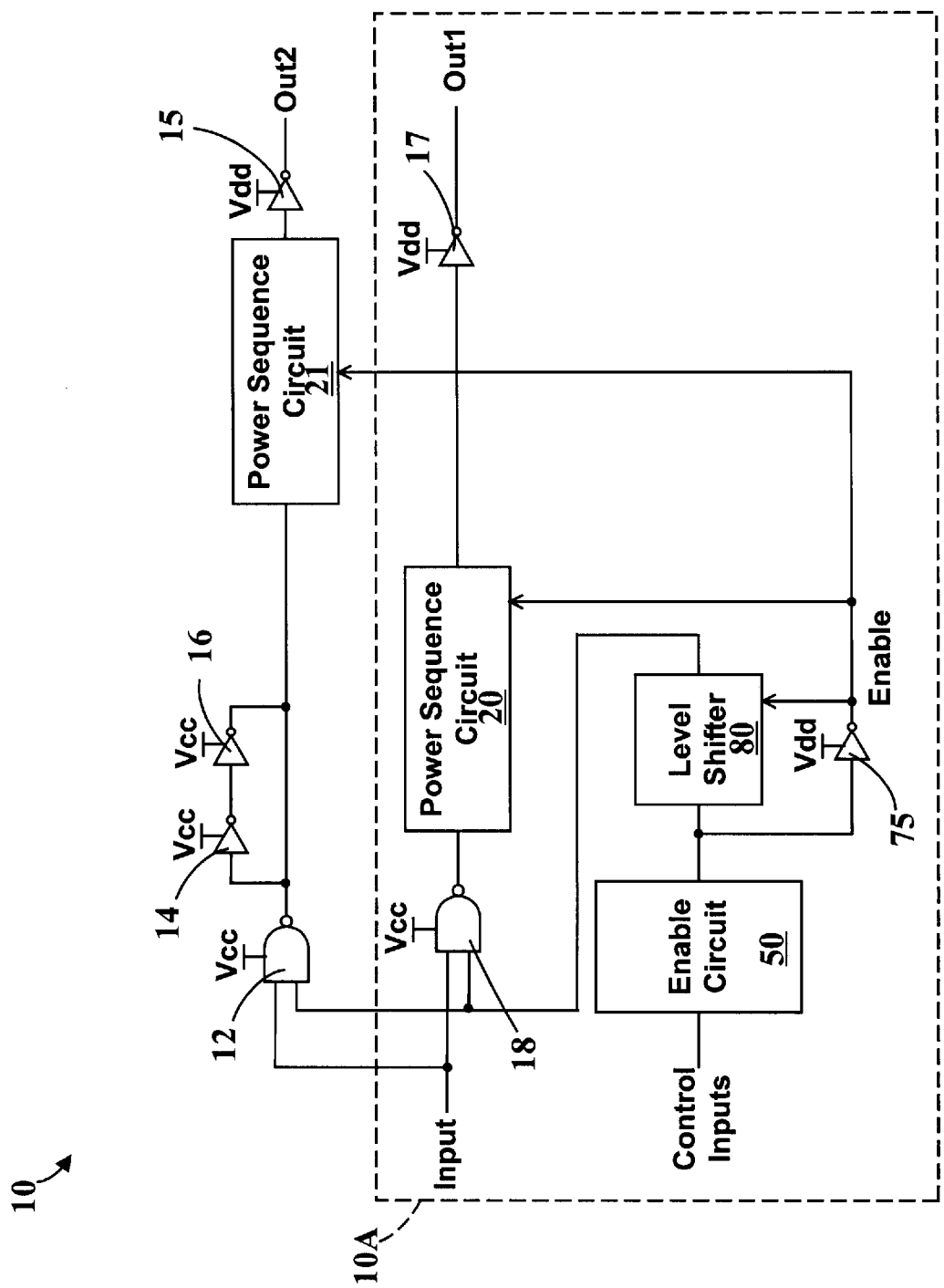
FIG. 1 is a block diagram of a receiver device having first output circuitry 10A in accordance with a first embodiment of the present invention.

FIG. 1 illustrates a block diagram of a receiver device 10 including power sequence circuits 20 and 21, enable circuit 50, level shifter 80, NAND gates 12 and 18, and inverters 14, 16, 15, 17, and 75 in accordance with a first embodiment of the present invention.

In this example, receiver device 10 and subsequent receiver devices of the present invention utilize a first voltage supply Vdd, and second voltage supply Vcc. For this specific example, receiver device 10 has a Vdd within the range of 0.9 volts (V) to 1.6 V and a Vcc within the range of 3.0 V to 3.6 V. Although only two voltage supplies with specific voltage ranges are described and shown, receiver device 10 is not limited to such.

Also, in this example, each voltage supply supports a certain device topology. Specifically, as will be discussed in reference to FIGS. 1–5, Vdd supports a thin-oxide topology and Vcc supports a thick-oxide topology. Although these specific topologies will be described in reference to FIGS. 1–5, the invention is not limited to such, and other device topologies that are suitable for voltage supplies of the present invention may also be used.

A first and second output Out1 and Out2 are shown. Although only two outputs are shown, receiver device 10, and subsequent receiver devices of the present invention are not limited to such.

The circuitry of Out1 (hereinafter referred to as first output circuitry 10A) includes NAND gate 18, inverter 75, output inverter 17, power sequence circuit 20, enable circuit 50 and level shifter 80.

NAND gate 18 of first output circuitry 10A receives a first input INPUT preferably from a bond pad on the same chip, and a second input from the output of level shifter 80. The output of NAND gate is coupled to power sequence circuit 20, which outputs Out1 via output inverter 17. NAND gate 18 uses Vcc as its power source and output inverter 17 utilizes Vdd.

Control inputs are inputted into enable circuit 50. Enable circuit 50 is coupled to level shifter 80 and inverter 75. Inverter 75, which may also be part of enable circuit 50, outputs an enable signal, Enable, which is inputted into level shifter 80, power sequence circuit 20, and power sequence circuit 21. Inverter 75 uses Vdd as its power source. Although enable circuit 50 (and enable circuits 150, 250, and 350 in subsequent figures) and inverter 75 are associated specifically with receiver device 10 (or receiver device 110 of FIG. 6), enable circuit 50 (with or without inverter 75) may also enable other receiver devices (not shown). That is, a system having a plurality of receiver devices may use a single enable circuit for enabling the plurality of receiver devices. Thus, the invention is not limited to a one-to-one association of enable circuits to receiver devices.

The second output circuitry consists of NAND gate 12, inverters 14, 16, and 75, output inverter 15, power sequence circuit 21, enable circuit 50, and level shifter 80. NAND gate 12, and inverters 14 and 16, utilize Vcc as their power source. Output inverter 15 and inverter 75 utilize Vdd. As with first output circuitry 10A, NAND gate 12 receives two inputs, INPUT and the output from level shifter 80. The output of NAND gate 12 is coupled to power sequence circuit 21 and the input of inverter 14. The output of inverter 14 is coupled to the input of inverter 16. The output of inverter 16 is coupled to the input of power sequence circuit 21, which outputs Out2 via output inverter 15. Power sequence circuit 21 is enabled through the Enable signal from enable circuit 50 and inverter 75.

Second output circuitry is similar in function and scope to first output circuitry 10A, except for the addition of hysteresis inverters 14 and 16, which supply additional noise immunity to the second output circuitry. Thus, second output circuitry will not be described in detail in subsequent figures, FIGS. 2–5 (except for the shared elements, enable circuit 50, level shifter 80, and inverter 75). Additionally, power sequence circuit 21 is similar in circuitry, scope and function to power sequence circuit 20, and thus will not be described in detail in reference to the first embodiment of the present invention.

In operation, the output inverters 15 and 17 are forced to a zero state whenever the first voltage supply of receiver 10 is disconnected, as will be discussed in greater detail with reference to FIGS. 2–5. Thus, the power-up sequence can occur in any order without affecting the reliability of receiver 10 of the present invention.

Power sequence circuits 20 and 21 of the present invention isolate the use of the first and second power supplies, which prevents a large skew between rise and fall transitions at Out1 and Out2 at low Vdd voltages. The isolation of power supplies by power sequence circuits 20 and 21 also allows output inverters 15 and 17 and other output devices of power sequence circuits 20 and 21 to be composed of a first device topology, or, in this specific example, a thin-oxide material (that is, the output devices may be powered by Vdd instead of Vcc). The details of power sequence circuit 20 (and thus, power sequence circuit 21) will be discussed in reference to FIG. 2.

Figure 2:
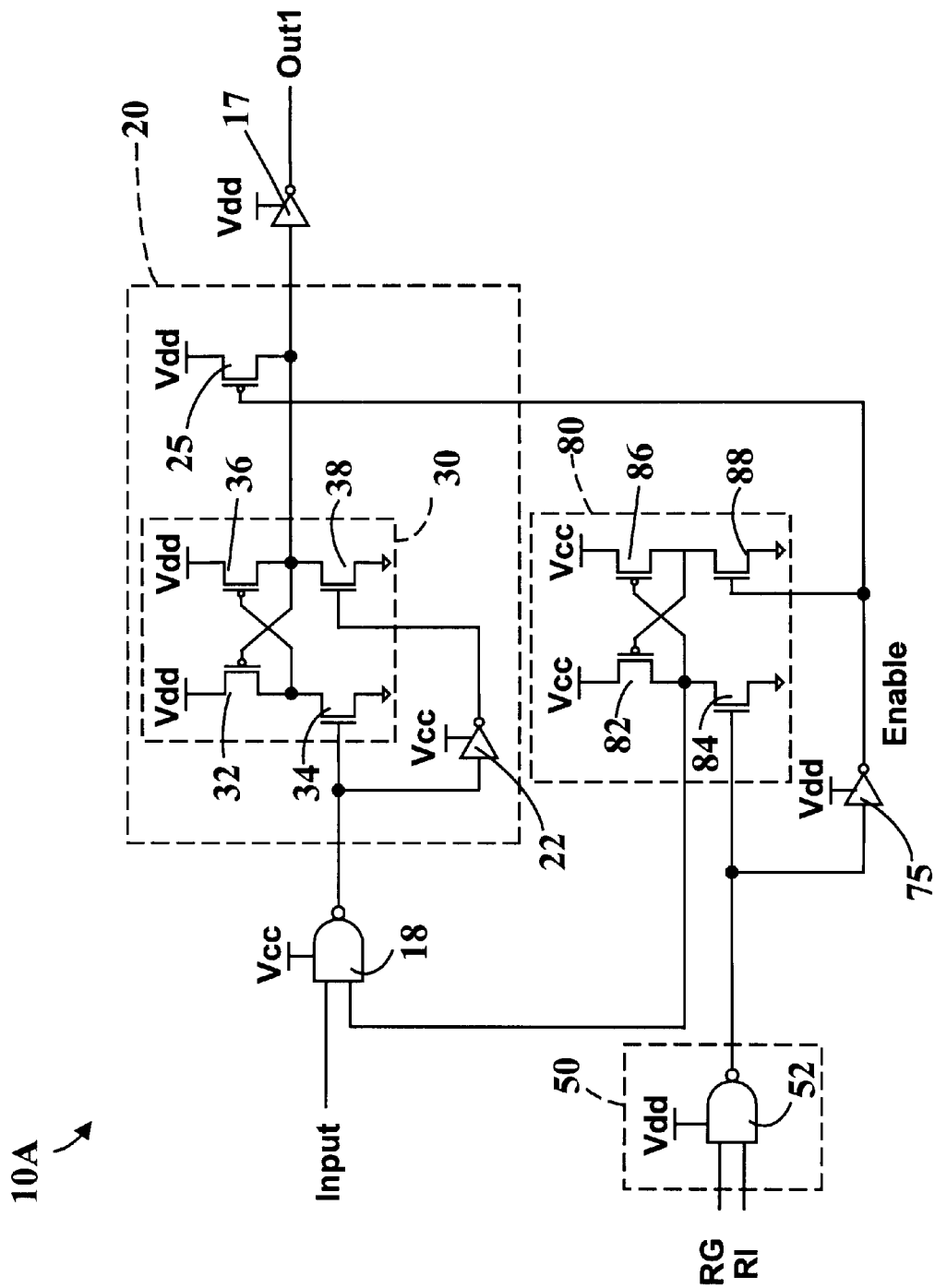
FIG. 2 is a circuit diagram of first output circuitry 10A of the receiver in FIG. 1.

FIG. 2 is an exemplary circuit diagram of the first output circuitry 10A of receiver device 10 in accordance to the first embodiment of the present invention. As with this and subsequent figures, like reference numerals indicate similar elements, and once described, may not be detailed in subsequent figures. In this example, enable circuit 50 comprises NAND gate 52, which uses Vdd as its power source. Control inputs, RG and RI are inputted into enable circuit 50.

Level shifter 80 comprises PFETs 82 and 86 and NFETs 84 and 88. PFET 82 and NFET 84 are coupled between Vcc and ground. Likewise, PFET 86 and NFET 88 are coupled between Vcc and ground. The gate of NFET 84 receives the output of NAND gate 52. The gate of NFET 88 receives the output of inverter 75, which is coupled to the output of NAND gate 52. The gates of PFET 82 and 86 are coupled to the drains of NFETs 84 and 88, respectively. The gate of PFET 86 and drains of PFET 82 and NFET 84 are coupled to the input of NAND gate 18. All devices in level shifter 80 are of a second device topology, or, for this specific example, are thick-oxide devices.

Power sequence circuit 20 comprises level shifter circuit 30, inverter 22, and enable PFET 25. Level shifter circuit 30 includes PFETs 32 and 36 and NFETs 34 and 38. PFET 32 and NFET 34 are coupled between Vdd and ground. Likewise, PFET 36 and NFET 38 are coupled between Vdd and ground. The gate of NFET 34 receives the output of NAND gate 18. The gate of NFET 38 receives the output of inverter 22, which is coupled to the output of NAND gate 18. The gates of PFET 32 and 36 are coupled to the drains of NFETs 34 and 38, respectively. The gate of PFET 32 and drains of PFET 36 and NFET 38 are coupled to the drain of enable PFET 25 and output inverter 17. The source of enable PFET 25 is tied to Vdd, and the gate of enable PFET 25 is coupled to the output of inverter 75 and receives the Enable signal therefrom.

In operation, enable PFET 25 is controlled by control inputs RG and RI. Thus, first output circuit 10A and receiver 10 will operate the same during power-up, power-down (e.g., sleep mode) or normal operation mode. That is, when Enable is low (i.e., RG and RI produce a high output at NAND gate 50), Out1 is low, independent of the value of INPUT. When Enable is high (i.e., RG and RI produce a low output at NAND gate 50), Out1 reflects the value of INPUT.

Level shifter circuit 30 of the present invention isolates the first and second voltage supply, allowing the use of thin-oxide devices for PFETs 32 and 36, enable PFET 25 and output inverter 17. Also, level shifter circuit 30 minimizes skew between rise and fall transitions. NAND gate 18, inverter 22, and NFETs 34 and 38 remain as thick-oxide devices as with prior receivers.

Figure 3:
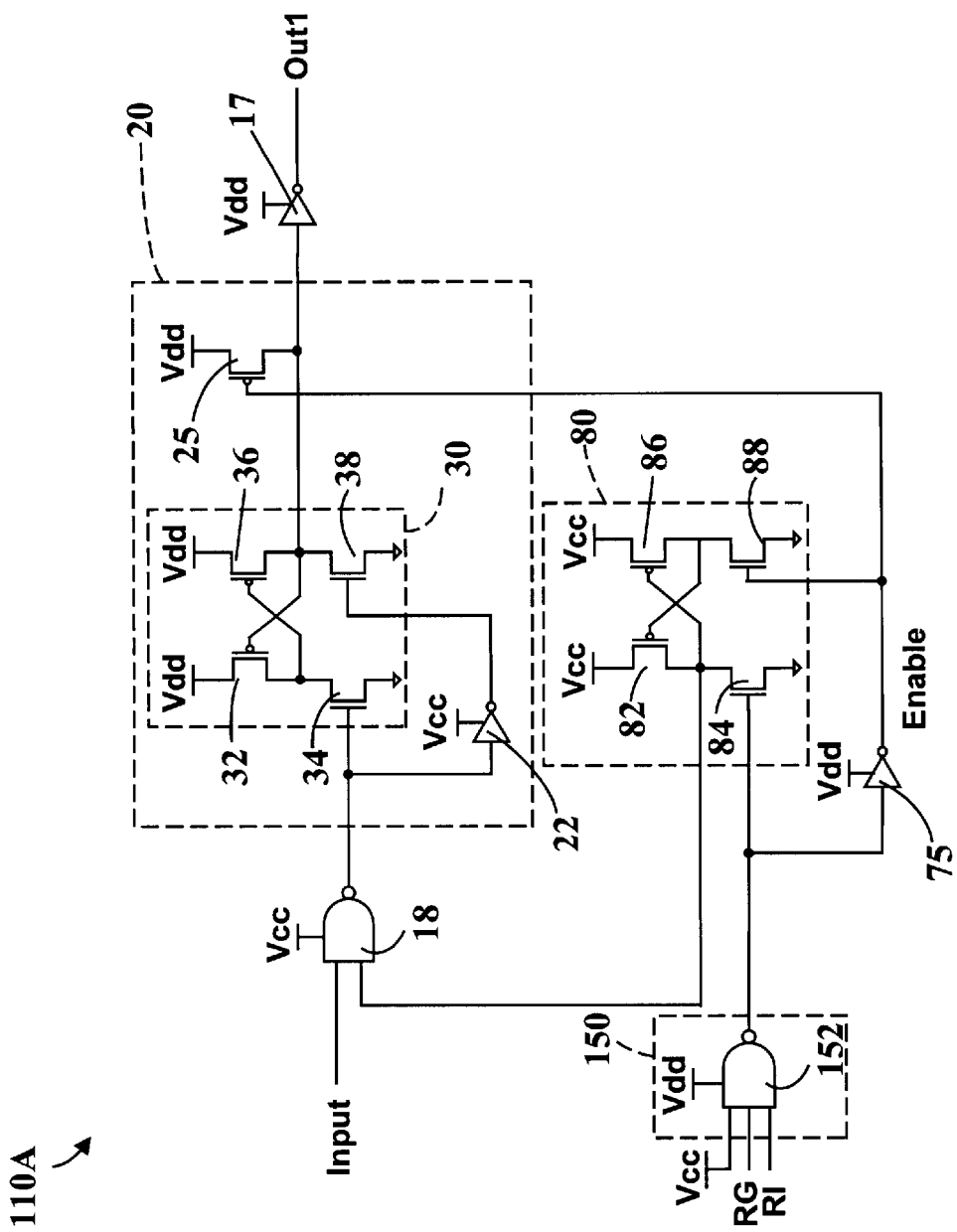
FIGS. 3, 4 and 5 are circuit diagrams of first output circuitry 10A of FIG. 1 illustrating three examples of enable circuit 50 of FIG. 1.
Figure 4:
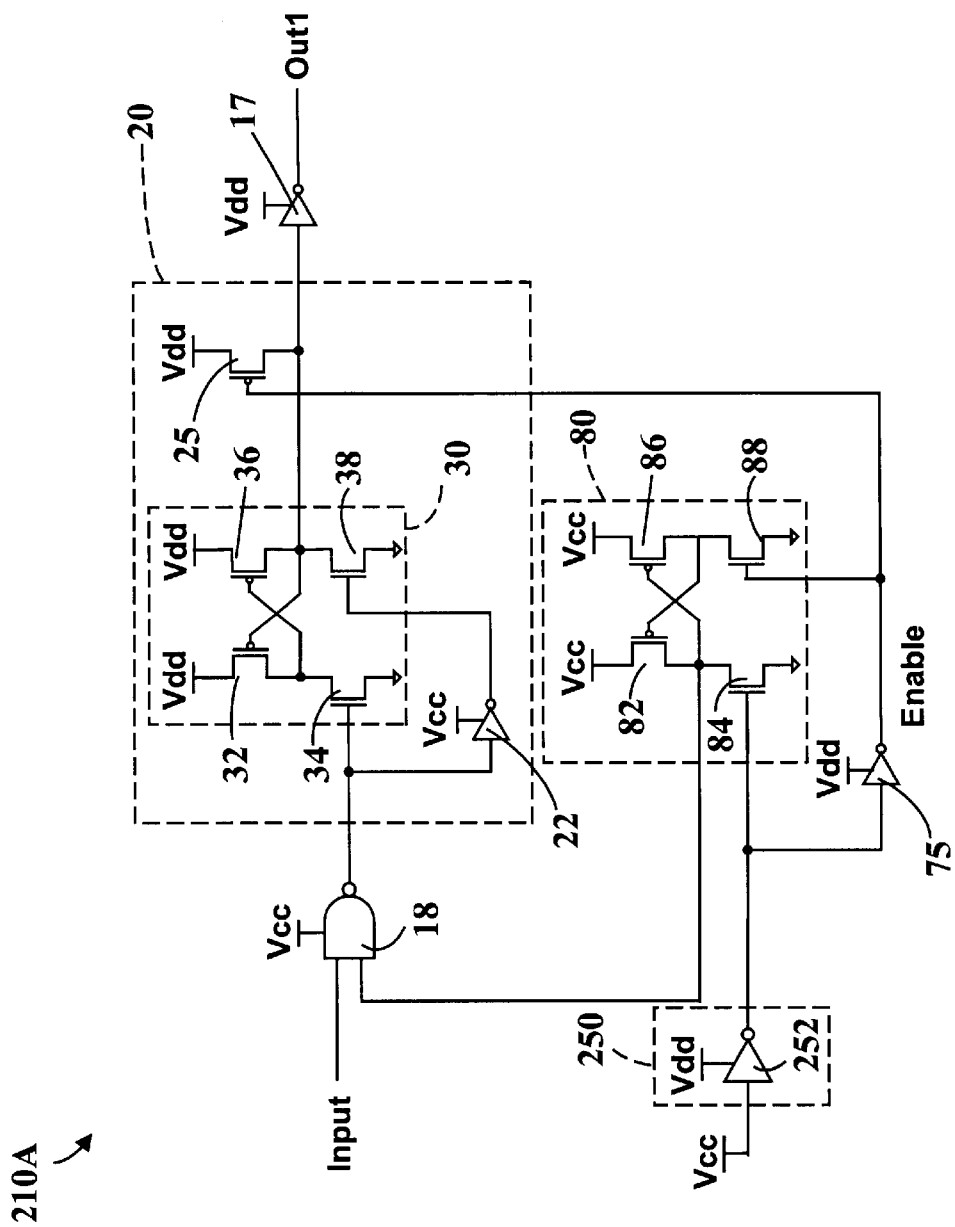
Figure 5:
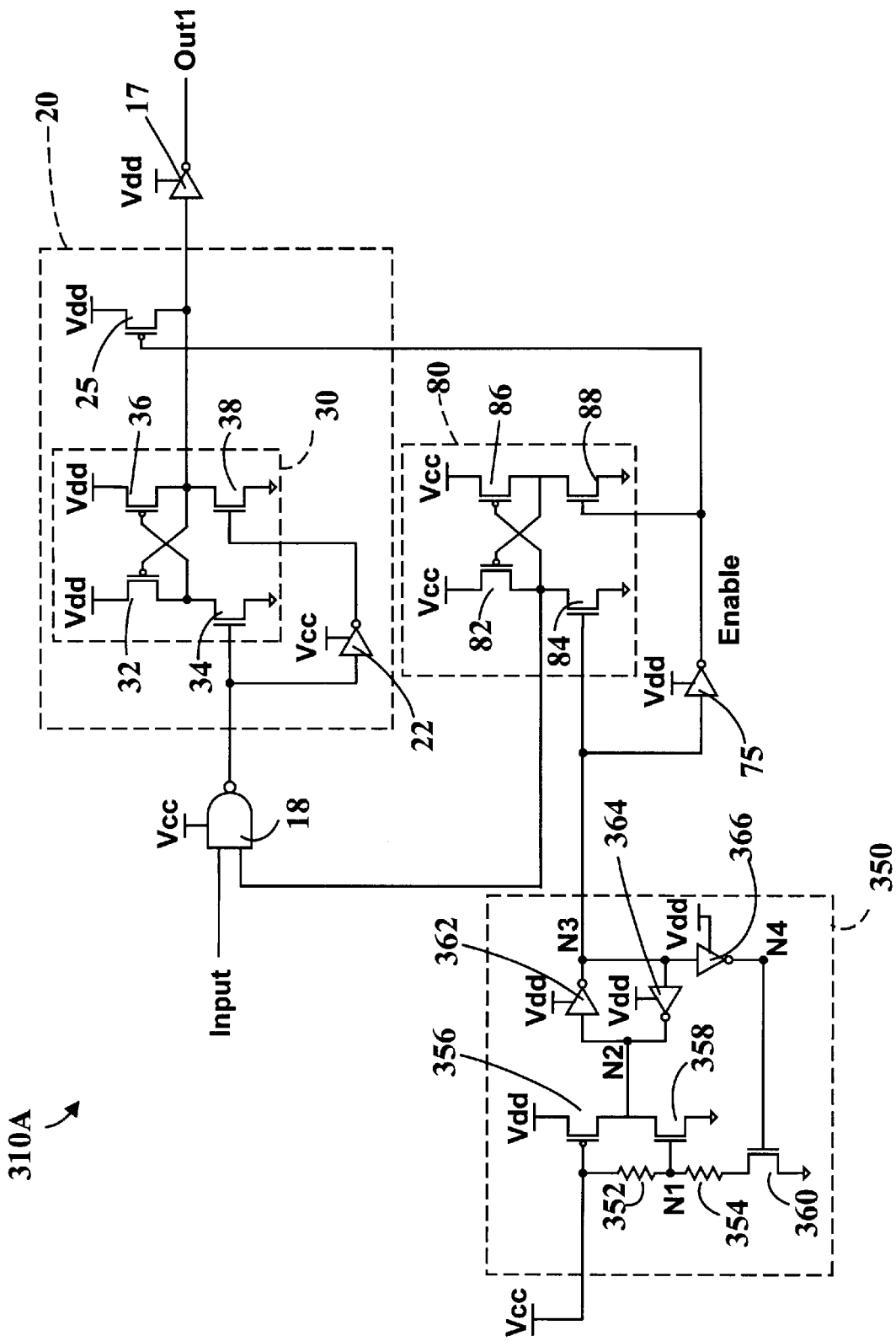

FIGS. 3–5 are circuit diagrams of the first output circuitry of receiver device 10 that are similar to the first output circuitry 10A of FIG. 2, except for enable circuit 50. Specifically, FIG. 3 is a circuit diagram of first output circuitry 110A having enable circuit 150, FIG. 4 is a circuit diagram of first output circuitry 210A having enable circuit 250, and FIG. 5 is a circuit diagram of first output circuitry 310A having enable circuit 350. Descriptions of similar elements (i.e., the circuitry and function of elements 18, 20, 17, 80 and 75) for FIGS. 3–5 are detailed in reference to FIG. 2.

FIG. 3 shows first output circuitry 110A that is similar to first output circuitry 10A of FIG. 2, except that enable circuit 150 of FIG. 3 comprises a 3-input NAND gate 152 instead of a 2-input NAND gate 52 as shown in FIG. 2. The control inputs into 3-input NAND gate 152 are RG, RI and second voltage supply, Vcc. Inputting Vcc into NAND gate 52 ensures that the output Out1 is forced to zero whenever Vcc is disconnected or powered down independent of the control signals.

FIG. 4 shows first output circuitry 210A that is similar to first output circuitry 10A of FIG. 2, except that enable circuit 250 of FIG. 4 comprises an inverter 252 instead of NAND gate 52 as shown in FIG. 2. In this example, the input of inverter 252 is Vcc. Inverter 252 uses Vdd as its power source. Control signals RG and RI are not used in this example. Inverter 252 will sense if Vcc is powered down.

FIG. 5 shows first output circuitry 310A that is similar to first output circuitry 10A of FIG. 2, except for enable circuit 350 of FIG. 5. Enable circuit 350 comprises resistors 352 and 354, PFET 356, NFETs 358 and 360, and inverters 362, 364, and 366. Inverters 362, 364, and 366 are powered by Vdd. PFET 356 and NFET 358 are coupled together between Vdd and ground. Control input Vcc is coupled to the gate of PFET 356 and to the first side of resistor 352. The second side of resistor 352 is coupled to the first side of resistor 354 and to the gate of NFET 358. The second side of resistor 354 is coupled to the drain of NFET 360, which has its source tied to ground. The drains of PFET 356 and NFET 358 are coupled together and to the input of inverter 362. The output of inverter 362 is coupled to the input of inverters 364 and 366, and to the inputs of inverter 75 and level shifter 80. The output of inverter 364 is coupled to the input of inverter 362. The output of inverter 366 is coupled to the gate of NFET 360. Resistors 352 and 354, as well as transistors 356, 358 and 360 are of a topology capable of supporting Vcc, while the remainder of enable circuit 350 may be comprised of topologies capable of supporting Vdd. The topologies used may include, but are not limited to, a mixture of thick and thin oxide FETs.

In operation, enable circuit 350 senses Vcc in each of its four states, that is, when Vcc is stable low, when Vcc is rising from low to high, when Vcc is stable high, and when Vcc is descending from high to low. As will be described in detail below in reference to these four states, enable circuit 350 is able to lock into a stable and valid state before a power up or power down glitch can occur, thus producing a valid Enable signal.

When Vcc is stable low, PFET 356 is on, and the cross-couple formed by inverters 362 and 364 holds node N2 high. Node N3 is held low. Node N4 will be high, which turns on NFET 360. At steady state, no current should flow through devices NFET 360 or resistors 352 and 354, and node N1 is low. Thus, NFET 358 is off, preventing any leakage path from PFET 356 to NFET 358. Node N3 indicates to the rest of the receiver that Vcc is not present. The cross-couple function of inverters 362 and 364 and resistor divider (resistor 352/resistor 354) isolate node N3 from changing with any noise coupling onto Vcc.

When Vcc is rising from low to high, PFET 356 will turn off at a certain threshold voltage. At this point, node N3 is still held low by the cross-coupling of inverters 362 and 364. As Vcc rises, the voltage at node N1 rises, but because NFET 360 is on, node N1 lags the rising of Vcc by a resistor division. Resistors 352 and 354 are set so that most of the voltage is taken across resistor 352.

The ratio of resistor 352 to resistor 354 is used in setting the enable circuit's 350 trip point relative to Vcc. That is, the pre-determined resistor division will determine at what percentage of Vcc the valid Enable signal comes on. As the voltage at node N1 overcomes the threshold voltage of NFET 358, NFET 358 will turn on and overcome the cross-coupled inverters, which will then set node N2 low and node N3 high. Node N3 signals that Vcc is available.

When Vcc is stable high, node N4 is low, turning off NFET 360. PFET 356 remains off and NFET 358 remains on. The cross-coupled inverters 362 and 364 hold node N3 high and no DC leakage exists because NFET 360 is off.

Finally, when Vcc drops from high to low, PFET 356 begins to turn on and NFET 360 begins to turn off. This happens because at stable high, PFET 356 and NFET 358 are working as an inverter, with the unity gain point of the system being determined by the combination of drive capabilities for PFET 356, NFET 358 and inverter 364. As Vcc drops and when the PFET 356 and NFET 358 "inverter" reaches unity gain, the cross-coupled inverters transition node N3 to low, signaling the absence of Vcc. Hence, the pre-determined values of FETs 356 and 358 will determine at what percentage of Vcc the Enable signal becomes invalid and is turned off.

Once node N3 goes low, node N4 will go high, turning on NFET 360. A resistive path is then formed from Vcc to ground, with the voltage at node N1 dropping and turning off NFET 358. Once the discharge of resistive the path is complete, node N1 is pulled all the way to ground, eliminating DC current and producing the Vcc stable low state.

In general, FETs 356 and 358, the cross-coupled inverters 362 and 364 and resistors 352 and 354 of enable circuit 350 ensure that a valid and stable state is reached and locked in, preventing a glitch during power up, or power down. The values of resistors 352 and 354 determine the percentage of Vcc needed to enable receiver device 310A (and any other receiver device that is connected to enable circuit 350), and the values of FETs 356 and 358 determine at what percentage of Vcc receiver device 310A will be disabled.

Figure 6:
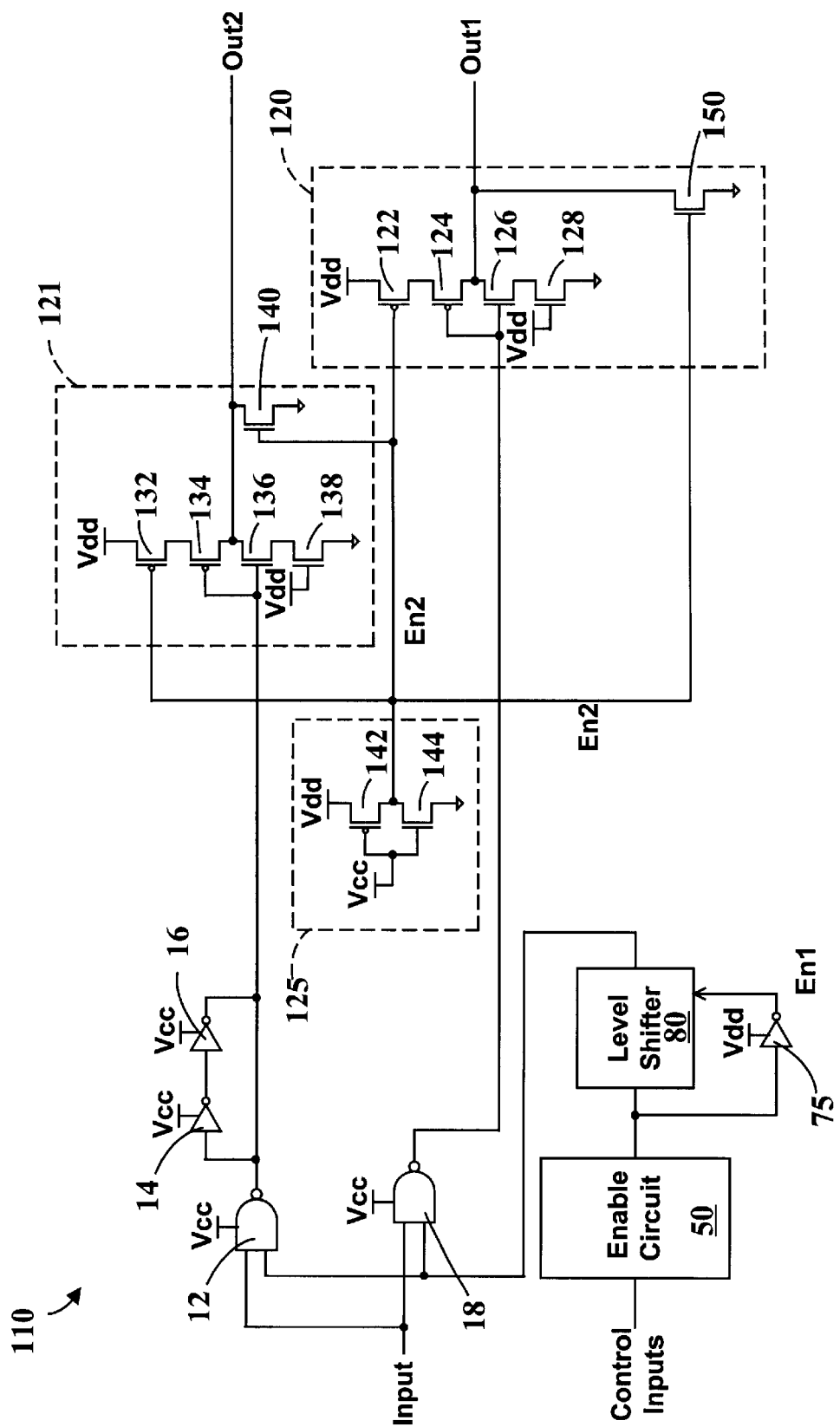
FIG. 6 illustrates a receiver device in accordance with a second embodiment of the present invention.

FIG. 6 illustrates a circuit diagram of a receiver device 110 in accordance to a second embodiment of the present invention. This embodiment is used for low voltages (e.g., Vdd may be in the range of 0.9 V to 1.6 V and Vcc in the range of 1.4 V to 1.6 V) wherein Vcc and Vdd are close in value. Although elements 12, 14, 16, 18, 50, 75 and 80 are similar to those of receiver device 10 of FIG. 1, the power sequence circuits 120 and 121 of FIG. 6 are different than those of FIGS. 1 and 2.

Furthermore, unlike FIG. 1, the elements of receiver device 110 may all be comprised of a single device topology (specifically for this example, a thin-oxide topology) since Vdd and Vcc are close in value. Although a thin-oxide topology is disclosed in reference to FIG. 6, the invention is not limited to such, and other device topologies that are suitable for voltage supplies of the present invention may also be used. FIG. 6 does not use elements 15 and 17 as in FIG. 1, and adds element 125 in accordance to the second embodiment of the present invention.

As with FIG. 1, receiver device 110 of FIG. 6 comprises a first and second voltage supply, Vdd and Vcc, respectively. A first and second output Out1 and Out2 are also shown.

Again, although only two voltage supplies and two outputs are shown, receiver device 110 is not limited to such.

Receiver device 110 of FIG. 6 includes NAND gates 12 and 18, inverters 14, 16 and 75, power sequence circuits 120 and 121, power sequence enable circuit 125, enable circuit 50 and level shifter 80. NAND gates 12 and 18 receive a first input INPUT preferably from a bond pad on the same chip, and a second input from the output of level shifter 80. The output of NAND gate 18 is coupled to power sequence circuit 120, which outputs Out1. The output of NAND gate 12 is coupled to power sequence circuit 121, which outputs Out2. NAND gate 12 is also coupled to the input of inverter 14. The output of inverter 14 is coupled to the input of inverter 16, and the output of inverter 16 is coupled to the input of power sequence circuit 121. NAND gates 12 and 18, and inverters 14 and 16 utilize Vcc as their power source.

Control inputs are inputted into enable circuit 50. Enable circuit 50 is coupled to level shifter 80 and inverter 75. Inverter 75 outputs an enable signal, En1, which is inputted into level shifter 80. Inverter 75 utilizes Vdd as its power source.

Power sequence enable circuit 125 outputs a second enable signal, En2, which is inputted into power sequence circuits 121 and 122. Power sequence enable circuit 125 includes PFET 142 and NFET 144. PFET 142 and NFET 144 are coupled together between Vdd and ground. The gates of PFET 142 and NFET 144 are tied to Vcc. The drains of PFET 142 and NFET 144 are coupled to the gates of PFET 132 and NFET 140 of power sequence circuit 121, and to the gates of PFET 122 and NFET 150 of power sequence circuit 120.

Power sequence circuit 120 comprises a modified NOR gate, including PFETs 122 and 124 and NFETs 126 and 128, and enable NFET 150. PFETs 122 and 124, and NFETs 126 and 128 are coupled together between Vcc and ground. The gate of PFET 122 receives En2. The gates of PFET 124 and NFET 126 are tied together and receive the output from NAND gate 18. The drains of PFET 124 and NFET 126 are also tied together and to the drain of enable NFET 150 and output Out1. The gate of NFET 128 is tied to Vdd. The gate of enable NFET 150 receives En2, and the source of NFET 150 is tied to ground.

Power sequence circuit 121 comprises a modified NOR gate, including PFETs 132 and 134 and NFETs 136 and 138, and enable NFET 140. PFETs 132 and 134, and NFETs 136 and 138 are coupled together between Vcc and ground. The gate of PFET 132 receives En2. The gates of PFET 134 and NFET 136 are tied together and receive the output from NAND gate 12. The drains of PFET 134 and NFET 136 are also tied together and to the drain of enable NFET 140 and output Out2. The gate of NFET 138 is tied to Vdd. The gate of enable NFET 140 receives En2, and the source of NFET 140 is tied to ground.

In operation, the outputs Out1 and Out2 are zero when Vcc is zero. That is, power sequence enable circuit 125 senses Vcc and turns off PFETs 132, 122 and enable NFETs 140 and 150 when Vcc is at a stable low, or is dropping from high to low. Conversely, power sequence enable circuit 125 turns on PFETs 132, 122 and disables NFETs 140 and 150 when Vcc is at a stable high, or is rising from low to high. The strength of PFET 142 in comparison to NFET 144 of power sequence enable circuit 125 allows for noise immunity and a strong pull-down ratio. That is, PFET 142 is weak in comparison to NFET 144, requiring Vcc to reach a determined threshold before power sequence enable circuit 125 indicates Vcc to be off.

The stacked PFETs 132 and 122 in power sequence circuits 120 and 121, respectively, prevent the current path from flowing in the incorrect direction. Therefore, no level shifter is needed in power sequence circuits 120 and 121 to isolate the output, allowing receiver 110 to operate at a higher speed than receiver 10 of FIG. 2. The thin-oxide elements of FIG. 6 also assist in speeding up the operation of receiver 110.

Thus, this invention provides a receiver device with multiple voltage supplies that allows the output stage of the receiver device to go to safe state (e.g., low) whenever its voltage is disconnected or powered-down, independent of any of its normal control circuits. Furthermore, the isolation of the multiple voltage supplies provides a low skew at the output of the receiver device.

While the invention has been particularly shown and described with reference to a specific embodiment thereof, it will be understood by those skilled in the art that the foregoing and other changes in form and details may be made therein without departing from the spirit and scope of the invention.

What is claimed is:

1. A receiver device comprising:
   a first and second voltage supply;
   an input circuit using the second voltage supply for receiving an input;
   a power sequence circuit using the first voltage supply, the power sequence circuit coupled to the input circuit and outputting an output corresponding with the input when enabled and placing said output in a safe valid voltage level when disabled, the power sequence circuit including:
      a level shifter for isolating said first voltage supply from said second voltage supply; and;
      an enable PFET, coupled to said enable circuit and said level shifter, for placing the output of said power sequence circuit at a safe voltage level when said enable circuit outputs an enable signal at a first voltage level, wherein said first voltage level of said enable signal corresponds to when said second voltage supply drops below a predetermined value; and
   an enable circuit, coupled to the power sequence circuit for enabling and disabling the power sequence circuit corresponding to a voltage level of the second voltage supply, the enable circuit including:
      a NAND gate, powered by said first voltage supply, for receiving control inputs and outputting an inverted enable signal; and
      an inverter, coupled to the output of said NAND gate for outputting said enable signal.

2. The device of claim 1, wherein one of said control inputs comprises said second voltage supply.

3. A receiver device comprising:
   a first and second voltage supply;
   an input circuit using the second voltage supply for receiving an input;
   a power sequence circuit using the first voltage supply the power sequence circuit coupled to the input circuit and outputting an output corresponding with the input when enabled and placing said output in a safe voltage level when disabled, the power sequence circuit including:
      a level shifter for isolating said first voltage supply from said second voltage supply; and;
      an enable PFET, coupled to said enable circuit and said level shifter, for placing the output of said power sequence circuit at a safe voltage level when said enable circuit outputs an enable signal at a first voltage level, wherein said first voltage level of said enable signal corresponds to when said second voltage supply drops below a predetermined value; and an enable circuit, coupled to the power sequence circuit, for enabling and disabling the power sequence circuit corresponding to a voltage level of the second voltage supply, the enable circuit including:

a PFET, having a source, gate and drain, the source tied to said first voltage supply, and the gate receiving said second voltage supply;

a first NFET, having a source, gate and drain, the drain coupled to the drain of said PFET, forming a first nodes the source tied to ground;

cross-coupled inverters, coupled between said first node and a second node and powered by said first voltage supply;

a second NFET, having a source, gate and drain, the source tied to ground;

an inverter, coupled between said second node and the gate of said second NFET and powered by said first voltage supply; and a first and second resistor, each having a first and second side, said first side of said first resistor coupled to tie gate of said PFET, the second side of said first resistor coupled to the first side of said second resistor and the gate of the said first NFET, and the second side of said second resistor coupled to the drain of said second NFET, wherein said enable signal is locked in at a valid voltage level at said second node corresponding to the voltage level of said second voltage supply.

4. A receiver device comprising:

a first and second voltage supply;

an input circuit using said second voltage supply for receiving an input;

a power sequence circuit using said fit voltage supply, said power sequence circuit coupled to said input circuit and outputting an output corresponding with said input when enabled and placing said output in a safe valid voltage level when disabled, the power sequence circuit including:

a modified NOR gate; and an enable NFET, coupled to said enable circuit and said modified NOR gate, wherein said modified NOR gate and said enable NFET places the output of said power sequence circuit in a safe voltage level when said enable circuit outputs an enable sin at a first voltage level, said first voltage level of said enable signal corresponding to when said second voltage supply drops below a predetermined value; and an enable circuit, coupled to said power sequence circuit, for enabling and disabling said power sequence circuit corresponding to a voltage level of said second voltage supply.

5. The device of claim 4, wherein said enable circuit comprises:

an inverter, powered by said first voltage supply, for receiving said voltage level of said second voltage supply and outputting said enable signal.

6. The device of claim 4, wherein said modified NOR gate comprises:

a first and second PFET, each having a gate, source and drain, the source of said first PFET tied to said first voltage supply, the drain of said first PFET coupled to the source of said second PFET, and the gate of said first PFET receiving said enable signal; and a first and second NFET, each having a gate, source and drain, the gate of said first NFET coupled to the gate of said second PFET and the output of said input circuits the drain of said first NFET coupled to the drain of said second PFET for outputting said output, the source of said first NFET coupled to the drain of said second NFET, the gate of said second NFET tied to said first voltage supply, and the source of said second NFET tied to ground.

7. A receiver device comprising:

a first and second voltage supply;

an input circuit using said second voltage supply for receiving an input, the input circuit including a level shifter, coupled to said enable circuit, and a NAND gate, coupled to said level shifter and said power sequence circuit, for receiving said input and an output of said level shifter, and outputting to said power sequence circuit;

a power sequence circuit using said first voltage supply, said power sequence circuit coupled to said input circuit and outputting an output corresponding with said input when enabled and placing said output in a safe voltage level when disabled; and an enable circuit, coupled to said power sequence circuit, for enabling and disabling said power sequence circuit corresponding to a voltage level of said second voltage supply.

8. A method of producing a valid output for a receiver device having a first and second voltage supply comprising the steps of:

a) sensing a voltage level of said second voltage supply with a NAND gate;

b) producing an enable signal from the NAND gate at a first voltage level when said second voltage supply is above a predetermined value;

c) producing an enable signal from said NAND gate at a second voltage level when said second voltage supply drops below a predetermined value;

d) enabling a power sequence circuit with said enable signal at said first voltage level;

e) disabling said power sequence circuit with said enable signal at said second voltage level;

f) outputting an output of said receiver device corresponding with an input of said receiver device when said power sequence circuit is enabled; and g) placing said output of said receiver device at a safe voltage level when said power sequence circuit is disabled.

9. A method of producing a valid output for a receiver device having a fist and second voltage supply comprising the steps of:

a) sensing a voltage level of said second voltage supply with an enable circuit;

b) sensing said second power supply with a PFET, an NFET, and a resistor divider;

c) producing an enable signal at a first voltage level when said second voltage supply is above a value predetermined by said resistor divider;

d) producing an enable signal at a second voltage level when said second voltage supply is below a value predetermined by said PFET and NFET;

e) producing an enable signal from said enable circuit at a first voltage level when said second voltage supply is above a predetermined value;

f) producing an enable signal from said enable circuit at a second voltage level when said second voltage supply drops below a predetermined value;

g) enabling a power sequence circuit with said enable signal at said first voltage level;

h) disabling said power sequence circuit with said enable signal at said second voltage level;

i) outputting an output of said receiver device corresponding with an input of said receiver device when said power sequence circuit is enabled; and j) placing said output of said receiver device at a safe voltage level when said power sequence circuit is disabled.

10. A system having at least one receiver device comprising:

a first and second voltage supply for each of at least one receiver device;

an input circuit for each receiver device using said second voltage supply for receiving an input;

an enable circuit, coupled to at least one of said power sequence circuit, for providing an enable signal at a first voltage level when the second voltage supply drops below a predetermined value;

at least one power se e circuit for each receiver device using said first voltage supply, each of said power sequence circuit coupled to said input circuit and outputting an output corresponding with said input when enabled and placing said output in a safe voltage level when disabled, the power sequence circuit including:

a modified NOR gate having a first and second PFET, each having a gate, source and drain, the source of said first PFET tied to said first voltage supply, the drain of said first PFET coupled to the source of said second PFET, and the gate of said first PFET receiving said enable signal;

a first and second NFET, each having a gate, source and drain, the gate of said first NFET coupled to the gate of said second PFET and the output of said input circuit, the drain of said first NFET coupled to the drain of said second PFET for outputting said output, the source of said first NFET coupled to the drain of said second NFET, the gate of said second NFET tied to said first voltage supply, and the source of said second NFET tied to ground; and an enable NFET, coupled to said enable circuit and said modified NOR gate, wherein said modified NOR gate and said enable NFET place the output of said power sequence circuit in a safe voltage level when said enable circuit outputs said enable signal.

11. A system having at least one receiver device comprising:

a fist and second voltage supply for each of at least one receiver device;

an input circuit for each receiver device using said second voltage sly for receiving an input;

an enable circuit for providing an enable signal at a first voltage level when said second voltage supply drops below a predetermined value;

at least one power sequence circuit for each receiver device using said first voltage supply, each of said power sequence circuits coupled to said input circuit and outputting an output corresponding with said input when enabled and placing said output at a known voltage level when disabled, each of said power sequence circuits having:

a modified NOR gate; and an enable NFET, coupled to said enable circuit and said modified NOR gate, wherein sad modified NOR gate and said enable NFET place the output of said power sequence circuit in a safe voltage level when said enable circuit outputs said enable signal.

* * * * *